United States Patent [19]
Hoover et al.

[11] Patent Number: 5,798,295
[45] Date of Patent: Aug. 25, 1998

[54] METHOD FOR FORMING A BURIED CONTACT ON A SEMICONDUCTOR SUBSTRATE

[75] Inventors: Andrew Paul Hoover, Austin; Gregory Alan Miller, Manchaca; Dale John McQuirk, Round Rock, all of Tex.; Winford Lee Hill, II, Radebeul, Germany

[73] Assignee: Motorola, Inc., Schaumburg, Ill.

[21] Appl. No.: 871,787

[22] Filed: Jun. 9, 1997

[51] Int. Cl.[6] .......................... H01L 21/425; H01L 21/22
[52] U.S. Cl. .................... 438/533; 438/564; 438/684
[58] Field of Search .......................... 438/533, 564, 438/684

[56] References Cited

U.S. PATENT DOCUMENTS

| | | | |
|---|---|---|---|
| 4,808,555 | 2/1989 | Mauntel et al. | 437/191 |
| 4,871,688 | 10/1989 | Lowrey | 437/47 |
| 5,126,285 | 6/1992 | Kosa et al. | 437/191 |
| 5,206,532 | 4/1993 | Roberts | 257/382 |
| 5,619,069 | 4/1997 | Ohta et al. | 257/692 |

*Primary Examiner*—John Niebling
*Assistant Examiner*—Michael S. Lebentritt
*Attorney, Agent, or Firm*—Keith E. Witek; George R. Meyer

[57] ABSTRACT

A method for forming al buried contact begins by forming an exposed contact area (22) of a substrate (10) having a surface (11). An undoped or lightly doped layer of polysilicon (32) is formed in contact with the contact area (22). A contiguous masking layer (36) is formed over one or more of the contact areas (22) to cover a contact portion of the layer (32) while exposing other portions of the layer (32). The other portions of the layer (32) are doped with dopant atoms (44). A heat cycle is used to laterally drive the dopant atoms (44) through the layer (32) and downward through a substrate surface (11) to form buried contact substrate-diffused regions (54). The resulting regions (54) have improved voltage punch-through resistance to laterally adjacent electrical diffusion regions since the masking layer (36) creates a longer thermal diffusion path for the dopant atoms which eventually reside in the regions (54).

22 Claims, 4 Drawing Sheets

METHOD FOR FORMING A BURIED CONTACT ON A SEMICONDUCTOR SUBSTRATE

FIELD OF THE INVENTION

This invention relates in general to manufacturing semiconductor wafers, and more particularly, methods of forming a buried contact structure to a doped region within a semiconductor substrate.

BACKGROUND OF THE INVENTION

Many different types of contact structures are used to create electrical connections between silicon layers and an underlying substrate. One of the more common types is a buried contact as illustrated in FIG. 1. FIG. 1 illustrates a semiconductor device substrate 10 with a primary surface 11. In the formation of buried contacts, semiconductive silicon members 14 are formed over the primary surface 11 and field isolation regions 12 as illustrated. In order to form a buried contact, the silicon members 14 are doped with dopant atoms, and the dopant atoms are thermally diffused into the substrate 10 through the surface 11 to form the doped regions 16. The doped regions 16 make buried electrical contacts between the layer 14 and the substrate. Note that the vertical depths of the doped regions 16 into the substrate lie below the substrate depth of the bottom of the field isolation regions 12. Typically, the doped regions 16 are about one micron deep into the substrate 10 with the field oxide regions 12 consuming less than 1 micron of material into the substrate.

In some buried contact substrate locations, the lateral spacing between adjacent doped regions 16 becomes very narrow as illustrated by gap 18 in FIG. 1. This narrowing is due to the deep depth of the region 16 of FIG. 1 due to thermal processing. A general rule of thumb in the integrated circuit industry is that every thermally driven unit of depth results in a laterally outdiffusion of 0.8 units. Therefore, by rule of thumb, a doped region that is thermally driven 1.0 microns into the surface will laterally outdiffuse roughly 0.8 microns. This lateral diffusion brings laterally adjacent doped regions very close together as illustrated by gap 18 of FIG. 1. When the buried contact doped regions 16 diffuse too close together due to wafer thermal processing, the punch-through voltage between the two doped regions 16 underneath the center field isolation region 12 can become less than three to five volts which is within the range of the power supply voltage VDD. If the punch-through or breakdown voltages of these regions fall below VDD, then the device is either rendered non-functional or burdened by extreme leakage current which is unacceptable for typical device performance. Further, the doped region 16 may cause unacceptably low field threshold voltages whereby conductive layers overlying field oxide regions may improperly create inversion regions under the field oxide creating unwanted electrical short circuits.

Several methods have been proposed for correcting this buried contact punch-though problem which results from thermally diffusing buried contact junctions too close to other lateral adjacent substrate junctions. In a first prior art method, the doping within the members 14 of FIG. 1 is reduced so that there are less dopant atoms which can diffuse through the surface 11 into the substrate. By reducing the number of dopant atoms in the regions 16 and 14, break-down voltage is improved. However, the reduced doping occurs throughout the entire member 14 whereby the resistance of member 14 greatly increases thereby adversely reducing integrated circuit (IC) speed. The increased resistance from this process is not desirable or acceptable.

In a second prior art method, the design rules of an integrated circuit (IC) may be changed to make separation regions between buried contacts much greater whereby break-down voltages are improved by enlarging the gap 18. However, the increasing of critical design rules increases overall IC die size, decreases the number of functional die per wafer, requires a redesign of existing IC masks, and may prolong time to market. Therefore, this second method is not an overly desirable solution.

In a third prior art method, the field isolation regions 12 are formed with a underlying counter-doped region referred to as a halo region. For example, if the regions 16 are N-type, P-type dopant atoms are positioned underneath the field regions 12 within the gap 18. These halo regions therefore underlie the field isolation regions 12 and are doped opposite the doping of the regions 16. This opposite doped halo region will increase punch-through protection by increasing the voltage required to conduct between the regions 16. However, halo implants require additional IC masking and additional processing, such as additional ion implanting and thermal drive steps. In addition, this additional processing may be inadequately robust thereby requiring design rule changes similar to that discussed above for the second prior art method.

In a fourth prior art method, a lightly doped polysilicon layer is first deposited on the substrate. This lightly doped polysilicon layer is reacted with a refractory metal to form a silicide layer wherein this silicide layer is also used to short the lightly doped polysilicon layer to the substrate. This method of using a composite polysilicon/silicide buried contact extremely complicates the process flow. In addition, some silicide materials are known to adversely restrict subsequent thermal budgets thereby limiting thermal processing after the silicide layer has been formed.

Therefore, a process is needed to form buried contacts having reasonably acceptable field punch-through voltages without resulting in higher contact resistance, requiring design rule changes, or increasing process complexity.

BRIEF DESCRIPTION OF THE DRAWINGS

The present invention is illustrated by way of example and should not be limited by the accompanying figures; like elements are labeled with identical numbers where appropriate, and in which.

Skilled artisans will appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A method for forming a buried contact has been developed where a first portion of the polysilicon buried contact layer overlying the buried contact is masked via a masking layer while a second portion of the polysilicon buried contact layer removed from the substrate buried contact region is exposed to dopant atom introduction. The masking layer used herein is also utilized to mask polysilicon portions to form polysilicon resistors, whereby no additional processing steps or additional processing complexity is added to the total process by the polysilicon buried contact layer masking steps taught herein. By forming this masking layer over the polysilicon layer to form resistors and buried contacts concurrently, the dopant atoms are placed into the polysilicon so that the dopant atoms are initially removed from the field oxide edges of the buried contact opening. Thermal diffusion is then used to drive the dopant atoms laterally through the polysilicon to the substrate contact areas through the masked/undoped portions of the polysilicon layer. Since the diffusion path of the dopant atoms (e.g. phosphorus) is longer due to the masked portion of the polysilicon, the resulting depth of the buried contact PN junction is reduced. However, even though the length of diffusion is longer, the doping of the substrate buried contact is still high resulting in low diffusion and polysilicon resistance while the buried contact depth is reduced. The result is a buried contact that is fully functional, lower in resistance, less complex to form, and superior in punch-through protection from the prior art processes discussed herein.

In other words, the process taught herein: (1) adds no complexity to the total process since the masking layer used for buried contact masking is also used for other device integration purposes (e.g., making polysilicon resistors); (2) does not adversely reduce the composite/final doping of the polysilicon layer; (3) does not require design changes of critical dimensions; (4) reduces buried contact PN junction depth thereby improving punch-though protection; and (5) is easily integrated into conventional silicon processing unlike the prior art methods discussed hereinabove. The reduced dopant atom depth and reduced outdiffusion of the polysilicon buried contact area allows high field punch-through voltages to be achieved without adversely impacting buried contact resistance. There are many alternate ways of achieving the final results of this invention as will be described below with respect to the FIGS. 2–9.

Figure 2:
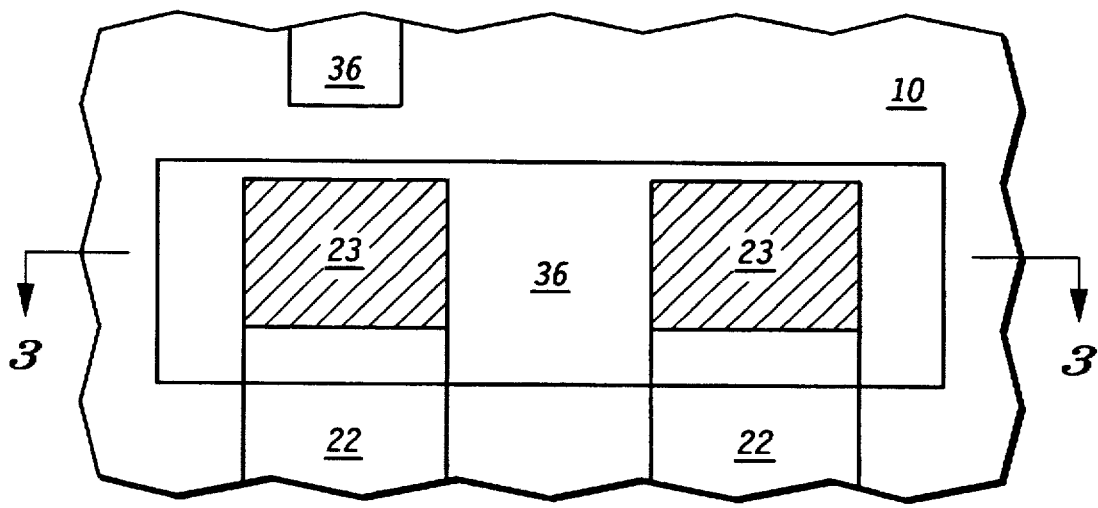
FIGS. 2 and 3 includes illustrations of a plan view and a cross-sectional view, respectively, of a portion of a semiconductor device substrate after forming masking portions over a semiconductor layer.
Figure 3:
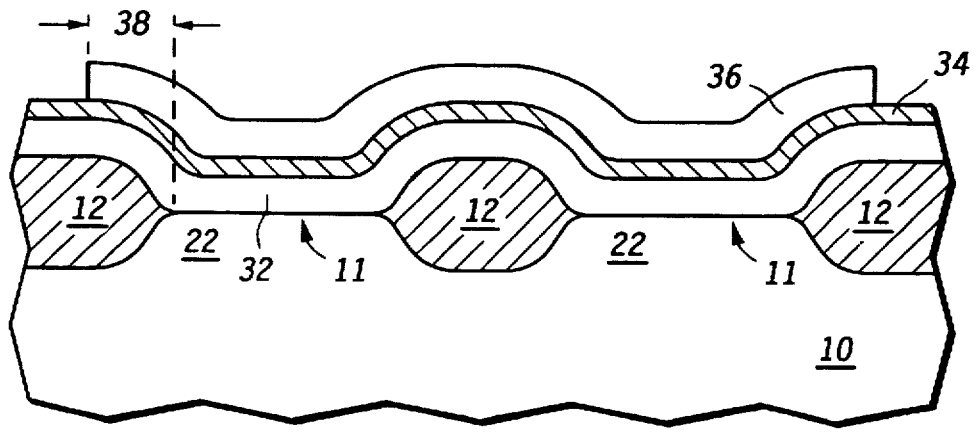

FIGS. 2 and 3 include illustrations of a top view and a cross-sectional view, respectively, of a portion of a semiconductor device substrate 10. As illustrated in FIG. 3, the substrate 10 includes a primary surface 11 in which field isolation regions 12 have previously been formed. The field isolation regions 12 may be formed by local oxidation of silicon (LOCOS) or its modified versions, trench isolation or the like. Typically, the bottom of the field isolation regions lie at an elevation in a range of approximately 0.3–0.4 microns below elevation of the primary surface 11 of the substrate 10. Gate oxide regions (not specifically illustrated in FIG. 3) are formed and openings 23 (see FIG. 2) in these gate oxide regions are made for the purposes of forming a buried contact to the substrate 10.

A semiconductor layer 32 is deposited over the primary surface 11 and the field isolation regions. The semiconductor layer 32 is one or more of polycrystalline silicon, amorphous silicon, silicon carbide, silicon germanium, composite material thereof, or the like. A screening layer 34 is formed over the semiconductor layer 32. In this particular embodiment, the screening layer 34 typically is an insulating material and is no more than 500 angstroms thick. Screening layers are used, in some embodiments, to enable the use of a higher ion implant energy to allow for a greater Gaussian implant standard deviation dispersion of dopant atoms vertically through the polysilicon layers. In other words, implanting through a screening layer into polysilicon layers allows for a more controlled and uniform ion implanting process.

A resist layer is coated over the substrate 10 and patterned to form a resist mask 36 as in FIG. 3. It is important to note that the resist mask may be a hard mask such as silicon nitride or a plasma enhanced oxide (PEO), especially if ion implantation of polysilicon is replaced with thermal POCl$_3$ or PH$_3$ diffusion of dopant atoms into the polysilicon. Note that in a thermal diffusion embodiment, the screening layer 34 may be eliminated. The resist mask 36 covers buried contact portions and resistor portions of the semiconductor layer 32 during a subsequent doping step (see FIGS. 3–4). The resist mask 36 includes a portion that extends over all of the central field isolation region 12 as seen in FIG. 3. All the middle field isolation region 12 in FIG. 3 is covered because the width of the middle field isolation region 12 is at or near a minimum geometry, such as less than one micron. If the middle field isolation region 12 were greater than the minimum geometry, then the masking layer 36 could be segmented into two regions, one for each buried contact illustrated in FIG. 3. The offset 38 between the edge of the resist mask 36 and the corresponding edge of the field isolation region (where the field isolation region 12 contacts the primary surface 11) can be varied. In one embodiment, the offset 38 can be from zero to about two microns. In other embodiments, the offset may be taken as far as four microns. This offset 38 is a function of the extent of thermal processing cycles (i.e., the thermal budget of the dopant atoms placed within the layer 32), and whether subsequent doping steps would adequately diffuse down into the substrate 10 to form the buried contact.

Figure 4:
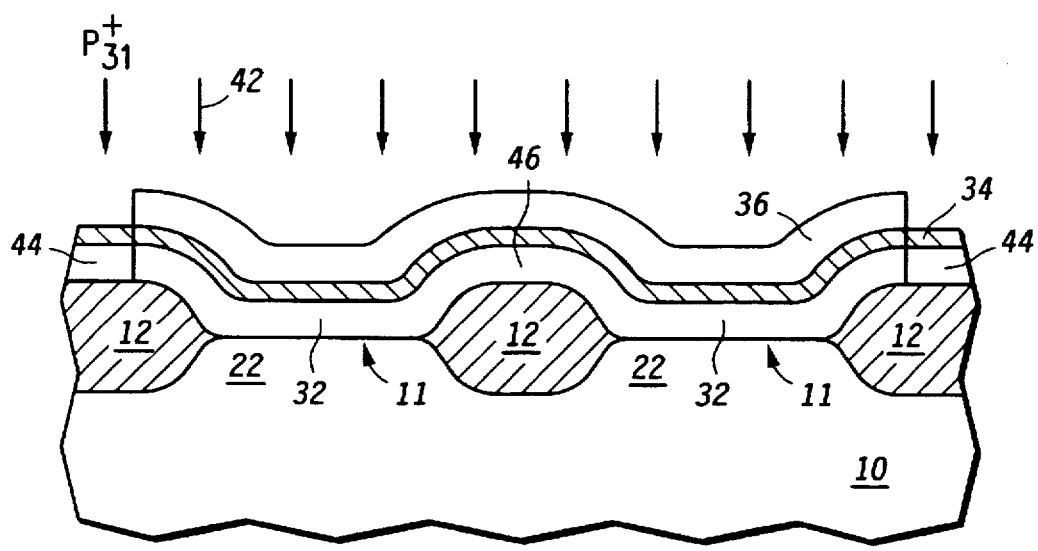
FIG. 4 includes an illustration of a cross-sectional view of the substrate FIG. 3 during doping step in accordance with one embodiment of the present invention.

In FIG. 4, the semiconductor layer 32 is selectively doped using ion implantation as illustrated in FIG. 4. In this particularly embodiment, phosphorous ions or like N-type ions are implanted in layer 32 as illustrated by arrows 42. The resist mask 36 essentially prevents implantation of dopant atoms into portions of the semiconductor layer 32 which underlie the resist mask 36 while allowing the exposed portions of the layer 32 which are not protected by the layer 36 to be implanted with dopants. Therefore, after the doping step of FIG. 4, the semiconductor layer 32 includes doped regions 44 that are not covered by the resist mask 36 and undoped regions 46 are covered by the resist mask 36. Clearly, other dopants may be used herein and include boron, arsenic, antimony, or the like.

Figure 5:
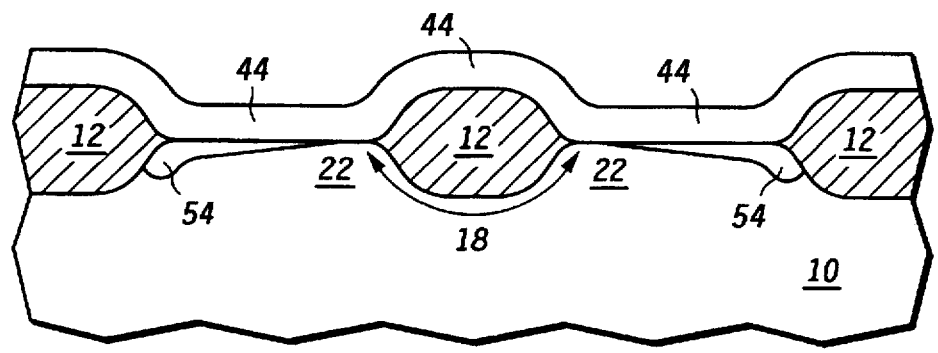
FIG. 5 includes an illustration of a cross-sectional view of a portion of the substrate of FIG. 4 after performing a thermal cycle to form doped regions within the substrate in accordance with one embodiment of the present invention.

In FIG. 5, the resist mask 36 and the screening layer 34 are removed and the substrate 10 and semiconductor layer 32 are then subjected to a dopant thermal drive step as illustrated in FIG. 5. During this step, the dopant from doped regions 44 laterally diffuses through undoped/masked portion of the semiconductor layer 32 except where polysilicon resistors are to be formed (the lateral diffusion through these structures are taken into account in the resistors thermal budget so as not to affect the final resistivity of the resistor devices). The undoped portions 46 in FIG. 4 become doped regions 44 in FIG. 5 via the laterally thermal diffusion of the dopant atoms within layer 32. The thermal cycle is designed to also diffuse some of the dopant atoms from layer 32 into the semiconductor device substrate 10 as illustrated by doped regions 54. Note that due to the lateral thermal drive component that the shape of the region 54 of FIG. 5 is not as uniformly deep as the prior art buried contact diffusion. The regions 54 are deeper near the outer field isolation regions 12 but shallower near the center field isolation region. In alternate embodiments, slightly shallower or slightly deeper junctions can be formed. The shape of the regions 54 are further advantageous since the gap 18 of FIG. 5 is widened thereby improving punch-through resistance due to the shape of the regions 54. These doped regions 54 will form the buried contact with the rest of the subsequently doped diffusion regions 22. The depth of the doped regions 54 are typically about 0.1-0.3 microns deep. Not all of the width of the active regions may be completely doped in some embodiments as illustrated in FIG. 5. However, this will not cause a problem because there will still be an electrical contact formed between the semiconductor layer 32 and the diffusion regions via the doped regions 54 within the substrate. Also, further thermal processing may follow during back-end processing whereby diffusion through polysilicon is much faster than through single-crystalline silicon resulting in an improved PN buried contact junction. Note that the final buried contact PN junction should be entirely formed in the single crystalline substrate to avoid larger bulk leakage current typically associated with polysilicon PN junctions.

Figure 6:
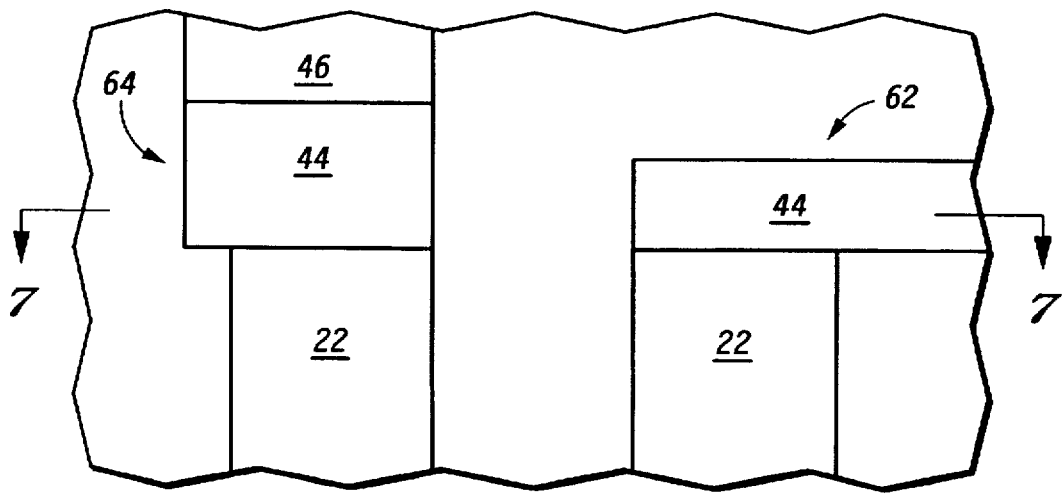
FIGS. 6 and 7 include illustrations of a plan view and a cross-sectional view, respectively of the substrate of FIG. 5 after performing a patterning step.
Figure 7:
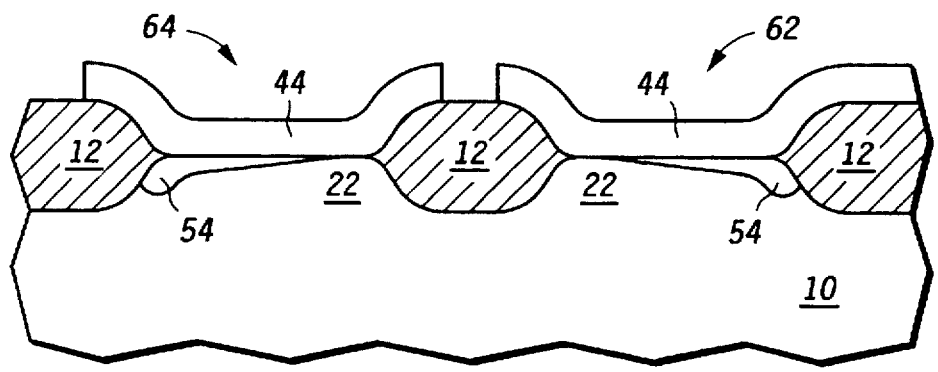

FIGS. 6 and 7 include illustrations of the device taught herein after patterning of the semiconductor layer 32. Referring specifically to FIG. 6, a local interconnect structure 62 has been formed extending from the buried contact region 22 (see FIG. 3) toward the right-hand side of FIG. 6. Although not illustrated, the local interconnect 62 may be part of a gate electrode, a capacitor electrode, a bipolar electrode, make contact to another region with the substrate 10, or be contacted to an overlying metal-level interconnect structure. The resistor element 64 of FIG. 6 includes a doped portion 44 that electrically connects the resistor 46 to the buried diffusion region 22. In one form, the buried diffusion region 22 will be an output node of an embedded SRAM cell which is coupled to the resistor 46 whereby the resistor 46 is a pull-up resistor to VDD for the SRAM cell. However, the undoped portion 46 of the resistor element 64 is a thin-film resistor that can be used for any resistive purpose.

Figure 8:
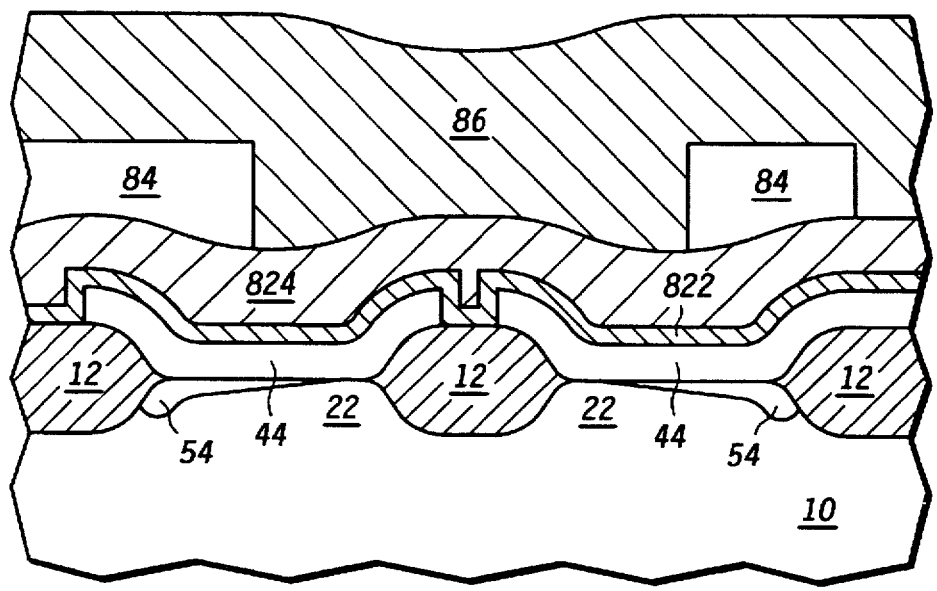
FIG. 8 includes an illustration of a cross-sectional view of a substantially completed device.

Processing is continued to form a substantially completed semiconductor device as illustrated in FIG. 8. An inter-level dielectric (ILD) layer 82 is formed that includes an undoped oxide film 822 and a doped oxide film 824. Contact openings are made through the interlevel dielectric layer 82, but are not illustrated in FIG. 8 for simplicity of illustration. Metallic interconnects/contacts 84 are then formed over the ILD layer 82, and a passivation layer 86 is formed over the metallic interconnects 84. Other ILD layers and interconnect levels may be formed, if needed, to complete the formation of the semiconductor device but are not shown in FIG. 8. The passivation layer 86 would still be formed over the uppermost level of interconnects.

The present invention includes many different alternate embodiments. One alternate embodiment is to replace the ion implantation step with a furnace doping cycle or thermal diffusion process. In this particular situation, the screening layer 34 is replaced by a hard masking layer that is substantially thick enough to act as a dopant mask under higher temperatures. The thickness of the hard masking layer is at least 1000 angstroms in most embodiments.

However, if at least a small portion of dopant can be tolerated within the semiconductor layer 32, the thickness of the hard masking layer can be reduced. The hard masking layer is patterned by etching the hard mask layer via a photoresist mask very similar or identical to the resist mask 36. The photoresist mask 36 and any other organic material are removed to prevent the likelihood of any organic contamination during the higher-temperature furnace doping step.

During the furnace doping cycle, a dopant such as phosphine ($PH_3$) or phosphorous oxychloride ($POCl_3$) can be used. Typically, this dopant step is performed at a temperature in a range of 800°–1000° C. The diffusion of the dopant from the furnace doping step may take place during the dopant-introduction step itself or during subsequent thermal step(s). The dopant atoms diffuse laterally through the semiconductor layer 32 and downwardly into a portion of the semiconductor substrate through the primary surface 11 to form doped region similar to the doped regions 54 as previously described (see FIG. 5 herein).

Figure 1:
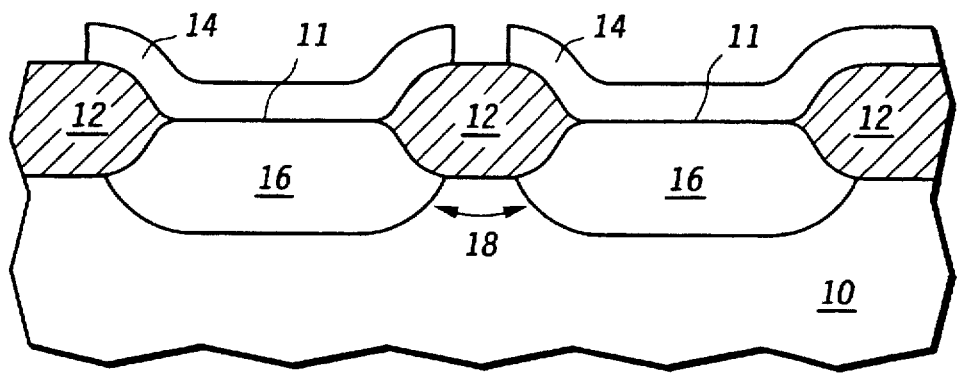
FIG. 1 includes an illustration of a cross-sectional view of a portion of a semiconductor substrate after forming buried contact structures (Prior Art).
Figure 9:
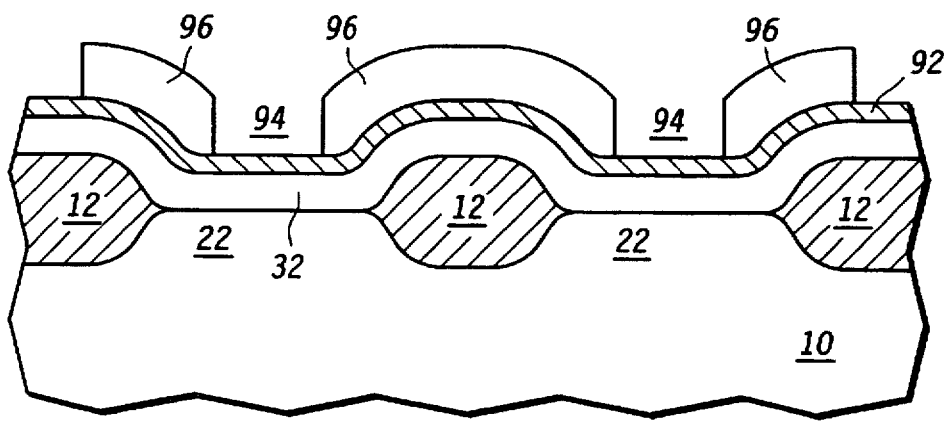
FIGS. 9–10 includes illustrations of a cross-sectional views of a portion of a semiconductor device substrate after performing a doping step in accordance with an alternate embodiment of the present invention.
Figure 10:
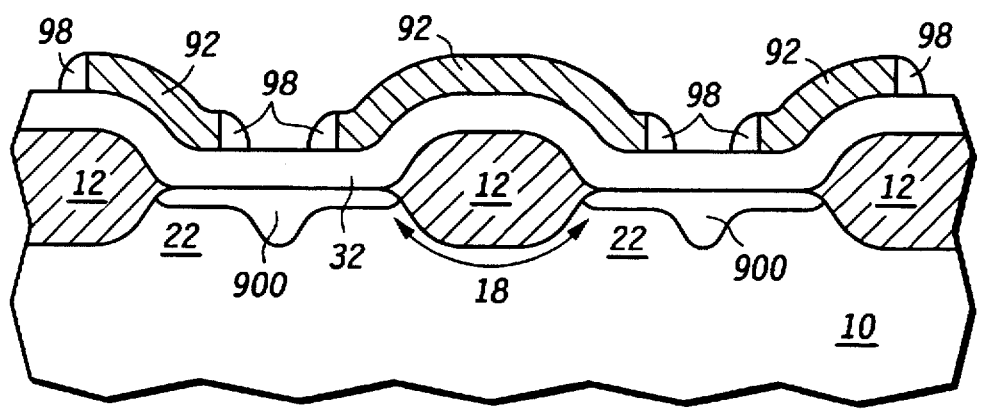

In still another alternative embodiment, the resist mask 36 may be adjusted so that the center portion of the diffusion region receives more dopant than the edges of the diffusion region near the field isolation regions 12. As illustrated in FIG. 9, the substrate 10 has been processed through the steps as shown in FIG. 2, except the resist mask 96 includes openings 94 over the center of the contact/diffusion regions 22. The layer 92 is less than 1000 angstroms in thickness in order to function as a proper screening layer for ion implantation processing. At this point, the dopant step could be performed or alternatively, the resist mask 96 is removed and sidewall spacers are formed to further shrink the dimension of the openings 94 as illustrated in FIG. 10. In this instance, the layer 92 of FIG. 10 is most likely made of a hard mask material such as silicon nitride or plasma enhanced oxide (PEO). Openings, like openings 94, may then be formed through this hard mask. Another hard mask material may then be deposited over the patterned hard mask and the openings 94 whereby this additional hard mask material is reactive ion etched (RIE) or the like to form the sidewall spacers 98 as illustrated in FIG. 10. By making the hard mask structure comprising layers 92 and 98, a buried contact diffusion 900 is formed whereby a peripheral depth of the buried contact diffusion is reduced. Therefore, a gap 18 between laterally adjacent buried contacts is increased thereby reducing punchthrough and breakdown voltage problems. This embodiment should not have the prior art problems discussed herein because the dopant concentration and depth near the edges of the field isolation regions 12 are reduced compared to the doped regions 16 of FIG. 1 as seen via regions 900 of FIG. 10.

In still other embodiments, the semiconductor layer 34 can be selected so that the semiconductor layer 34 and the substrate 10 are different. More particularly, the semiconductor layer 32 may include silicon germanium, which allows dopants to be activated and diffused at a lower temperature relative to a silicon substrate 10. In this particular situation, two different heat cycles may be used to achieve the proper doping characteristics. More specifically, a relatively lower-temperature step in a range of approximately 500°–700° C. is used to activate and diffuse the dopant throughout the semiconductor layer 32 while the substrate 10 is not substantially doped by this lower-temperature drive cycle. Subsequently, a higher-temperature drive cycle within a range of approximately 800°–1000° C. diffuses some of the dopant atoms from the silicon germanium layer 32 into the silicon substrate 10. In another example, the semiconductor layer 32 is polycrystalline silicon and the substrate 10 is monocrystalline silicon.

The present invention includes benefits particularly for semiconductor devices that have relatively narrow widths of field isolation regions. Still, the present invention can be used for wider field isolation regions.

In one particular embodiment manufactured in accordance with the processing taught herein, the field punch-through voltage underneath the field isolation region increased from approximately 4 volts for a prior art method to approximately 14 volts. In general, the punch-through voltage should be at least 10 volts, or twice the $V_{DD}$ potential to produce a final IC device with adequate leakage prevention margins. The present invention does have a small increase in buried contact resistance of approximately 10–30% over a conventional buried contact which does not significantly affect device performance. However, even if the 10%–30% resistance increase is experienced, the increased local contact resistance is not a problem for many semiconductor devices, especially in slower microcontroller designs. Another advantage of the present invention is its incorporation into a thin-film resistor process flow without adding any additional masking or deposition steps which complicate the overall IC processing. In many existing designs, a pre-existing resistor mask for defining the thin-film resistors is simply modified to contain additional portions which cover at least part of the doped region that forms the buried contacts. An additional advantage of the present invention is that the process herein does not require any additional or newly-added complicated processing steps to create the contact structures beyond the steps which are already needed for resistor formation and buried contact doping.

Still another advantage of the present invention is that it inherently compensates for mask X-Y misalignment. Referring to FIGS. 2 and 3, the resist mask 36 may be laterally misaligned and expose a portion of the primary surface 11 without adversely affecting the sidewall closed to the other adjacent buried contact. This benefit of the present invention should be realized as long as both portions of the primary surface 11 immediately adjacent to the center field isolation region 12 are not exposed. Furthermore, the total doping concentration of a single isolated buried contact is somewhat self-correcting with respect to misalignment. As a purely arbitrary example, if a doped region receives $2.0 \times 10^{12}$ dopant atom per unit volume and the mask is perfectly aligned so that the offset 38 on both sides of the contact region 22 are equal, then roughly $1.0 \times^{12}$ dopant atoms will come via diffusion from the left side and roughly $1.0 \times 10^{12}$ dopant atoms will come via diffusion from the right side. If mis-alignment occurs, one side will contribute more dopants atoms while the other side will contribute proportionally less dopant atoms whereby the total doping concentration of the buried contact diffusion should remain constant around $2.0 \times 10^{12}$ dopant atom per unit volume (i.e., self-compensated) for slight photographic mis-alignments in the X and Y direction. This helps to ensure lot-to-lot conformity between wafers.

Another advantage of the present invention is that it does not require modifying or being constrained to a current thermal cycle budget for the semiconductor device. Adjustments, if any, can be made by changing the offset 18 illustrated herein. Another advantage of the present invention is that it still allows heavy doping of the portions of the semiconductor layer away from the buried contacts. This becomes particularly important with the local interconnect 62 in that it continues to have reasonably low resistance.

Therefore, although the invention has been described and illustrated with reference to specific embodiments, it is not intended that the invention be limited to those illustrative embodiments. Those skilled in the art will recognize that modifications and variations may be made without departing from the spirit and scope of the invention. For example, a buried contact may be formed by etching through the gate oxide or by masking gate oxide formation in a particular buried contact region. It is intended that this invention encompass all the variations and modifications as fall within the scope of the appended claims.

We claim:

1. A method for forming an electrical contact, the method comprising the steps of:

providing a substrate;

forming field isolation overlying the substrate wherein the field isolation has an opening which exposes a first contact portion of the substrate;

depositing a semiconductor layer overlying the field isolation and being in contact with the first contact portion of the substrate;

forming a masking layer overlying the semiconductor layer;

processing the masking layer to make a masking region, the masking region overlying a first portion of the semiconductor layer where the first portion of the semiconductor layer overlies the first contact portion of the substrate, the masking layer exposing a second portion of the semiconductor layer wherein the second portion of the semiconductor layer surrounds the first portion of the semiconductor layer;

exposing the second portion of the semiconductor layer to dopant atoms; and elevating the temperature of the semiconductor layer to move the dopant atoms from the second portion of the semiconductor layer through the first portion of the semiconductor layer into the first contact portion of the substrate whereby a first electrical contact is formed between the first contact portion of the substrate and the semiconductor layer.

2. The method of claim 1 wherein the step of forming and processing the masking layer comprises:

forming the masking layer as an oxide layer.

3. The method of claim 2 wherein the step of exposing the second portion of the semiconductor layer to dopant atoms comprises:

performing thermal diffusion of the dopant atoms into the second portion of the semiconductor layer.

4. The method of claim 1 wherein the step of forming and processing the masking layer comprises:

forming the masking layer as a layer of photoresist.

5. The method of claim 4 wherein the step of exposing the second portion of the semiconductor layer to dopant atoms comprises:

performing ion implantation of the dopant atoms into the second portion of the semiconductor layer.

6. The method of claim 1 wherein the masking region has a sidewall and the first contact portion has a periphery, the step of processing the masking layer to make a masking region comprising:

forming the masking region wherein the sidewall of the masking region is offset from the periphery of the first contact portion by a distance between zero microns and four microns.

7. The method of claim 1 wherein the masking region has a sidewall and the first contact portion has a periphery, the step of processing the masking layer to make a masking region comprising:

forming the masking region wherein the sidewall of the masking region is offset from the periphery of the first contact portion by approximately one micron.

8. The method of claim 1 further comprising:

forming a second contact portion laterally adjacent the first contact portion and separated from the first contact portion by a field isolation region; and masking both the first and second contact portions with a contiguous single masking region as the masking region wherein the first electrical contact is formed laterally adjacent a second electrical contact formed in the second contact portion.

9. The method of claim 8 wherein the steps of forming a first and second contact portion comprises:

forming the first and second electrical contacts such that a breakdown voltage between the first and second electrical contacts is greater than 10 volts.

10. The method of claim 1 wherein the step of exposing and further moving the dopant atoms further comprises:

driving the dopant atoms through the semiconductor layer at a first temperature and driving the dopant atoms into the substrate at a second temperature wherein the first temperature is less than the second temperature.

11. The method of claim 1 wherein the step of processing the masking layer further comprises:

forming the masking region in an annular shape having a masking portion masking a periphery of the contact opening and an opening within the masking portion which exposes a central portion of the first contact portion.

12. The method of claim 11 wherein the step of processing the masking layer further comprises:

forming a sidewall spacer around the opening within the masking portion to reduce a radius of the opening of the masking portion.

13. The method of claim 1 wherein the step of further moving the dopant atoms further comprises:

forming a PN junction in the substrate wherein a first end of the PN junction has a first depth and a second end of the PN junction has a second depth wherein the first depth is greater than the second depth.

14. A method for forming an electrical contact, the method comprising the steps of:

providing a silicon substrate;

forming field isolation regions on the silicon substrate wherein a first opening and a second opening to the silicon substrate are defined by the field isolation regions, the first opening being laterally adjacent the second opening;

depositing a polysilicon layer in contact with the field isolation regions and in contact with the silicon substrate through both the first opening and the second opening;

forming an oxide masking layer over the polysilicon layer;

patterning and etching the oxide masking layer to form a masking region which is contiguous and overlies both the first and second openings, the masking layer forming exposed portions and unexposed portions of the polysilicon layer;

exposing the exposed portions of the polysilicon layer to an N-type doping environment to deposit N-type dopant atoms within the exposed portions of the polysilicon layer; and exposing the polysilicon layer to an elevated temperature to drive the N-type dopant atoms from the exposed portions of the polysilicon layer through the unexposed portions of the polysilicon layer and into the silicon substrate through the first and second openings to form a first buried contact within the first opening and a second buried contact within the second opening.

15. The method of claim 14 wherein the step of forming an oxide masking layer comprises:

forming the oxide masking layer as a layer of plasma enhanced oxide (PEO).

16. The method of claim 14 wherein the step of patterning and etching the oxide masking layer comprises:

forming a plurality of masking regions from the masking layer wherein a first masking region is used to form the first and second buried contacts and a second masking region is used to form a polysilicon resistor structure separated from the first and second buried contacts.

17. The method of claim 14 wherein the step of patterning and etching the oxide masking layer comprises:

forming the masking region having a periphery wherein the periphery of the masking region encloses a periphery of both the first anti second openings and wherein a periphery of the masking region is offset from a periphery of the first and second openings by roughly zero microns to four microns.

18. The method of claim 17 wherein the step of patterning and etching the oxide masking layer comprises:

forming the periphery of the masking region so that the periphery of the masking region is offset from the periphery of the first and second openings by roughly one micron.

19. The method of claim 14 wherein the step of patterning and etching the oxide masking layer to form a masking region further comprises:

forming the masking region in an annular shape having a masking portion masking a periphery of the contact opening and an opening within the masking portion which exposes a central portion of both the first and second openings.

20. The method of claim 19 wherein the step of patterning and etching the oxide masking layer to form a masking region further comprises:

forming a sidewall spacer around the opening within the masking portion to reduce a radius of the opening of the masking portion.

21. The method of claim 14 wherein the step of exposing the polysilicon layer to an elevated temperature further comprises:

forming a PN junction within the silicon substrate as part of the first buried contact wherein a depth of the PN junction is less than a depth of the field isolation regions into the silicon substrate.

22. A method for forming a buried contact, the method comprising the steps of:

providing a substrate comprising silicon;

forming field oxide isolation overlying the substrate wherein the field oxide isolation defines an opening which exposes a first contact portion of the substrate;

depositing a undoped layer of polysilicon overlying the field oxide isolation and being in contact with the first contact portion of the substrate;

forming an oxide masking layer overlying the undoped layer of polysilicon;

patterning and etching the oxide masking layer to make a masking region, the masking region overlying a first portion of the polysilicon where the first portion of the polysilicon overlies the first contact portion of the substrate, the masking layer exposing a second portion of the polysilicon wherein the second portion of the polysilicon surrounds the first portion of the polysilicon, an edge of the masking region being offset from a periphery of the first contact portion by zero microns to four microns; and exposing the second portion of the polysilicon to phosphorus atoms and elevating the temperature of the polysilicon to at least 800° C. to thermally diffuse the phosphorus atoms from the second portion of the polysilicon through the first portion of the polysilicon and into the first contact portion of the substrate whereby a buried contact is formed between the first contact portion of the substrate and the polysilicon.

* * * * *

UNITED STATES PATENT AND TRADEMARK OFFICE
CERTIFICATE OF CORRECTION

PATENT NO. : 5,798,295
DATED : August 25, 1998
INVENTOR(S) : Andrew Paul Hoover et al.

It is certified that error appears in the above-identified patent and that said Letters Patent is hereby corrected as shown below:

In Claim 17, Column 10, Line 31, change "anti" to - -and- -.

Signed and Sealed this

Eighth Day of December, 1998

Attest:

BRUCE LEHMAN

Attesting Officer     Commissioner of Patents and Trademarks